United States Patent
Mase et al.

(10) Patent No.: US 10,436,908 B2
(45) Date of Patent: Oct. 8, 2019

(54) RANGE IMAGE SENSOR

(71) Applicant: HAMAMATSU PHOTONICS K.K., Hamamatsu-shi, Shizuoka (JP)

(72) Inventors: Mitsuhito Mase, Hamamatsu (JP); Jun Hiramitsu, Hamamatsu (JP); Akihiro Shimada, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 272 days.

(21) Appl. No.: 15/302,178

(22) PCT Filed: Apr. 17, 2015

(86) PCT No.: PCT/JP2015/061876
§ 371 (c)(1),
(2) Date: Oct. 6, 2016

(87) PCT Pub. No.: WO2015/159977
PCT Pub. Date: Oct. 22, 2015

(65) Prior Publication Data
US 2017/0031025 A1    Feb. 2, 2017

(30) Foreign Application Priority Data
Apr. 18, 2014 (JP) .................. 2014-086175

(51) Int. Cl.
*G01S 17/89* (2006.01)
*G01S 17/36* (2006.01)
(Continued)

(52) U.S. Cl.
CPC ............ *G01S 17/89* (2013.01); *G01S 7/4914* (2013.01); *G01S 7/4915* (2013.01); *G01S 17/36* (2013.01);
(Continued)

(58) Field of Classification Search
CPC ........ G01S 17/89; G01S 17/36; G01S 7/4914; G01S 7/4915; H01L 27/14643; H01L 27/14612; H01L 27/14603; H04N 5/3745
(Continued)

(56) References Cited

U.S. PATENT DOCUMENTS

2012/0205723 A1* 8/2012 Suzuki .................... G01S 17/89
257/215
2013/0026384 A1   1/2013 Kim et al.

FOREIGN PATENT DOCUMENTS

CN    1842723    10/2006
CN    101996004  3/2011
(Continued)

OTHER PUBLICATIONS

Machine translation of JP2012-083213, created Oct. 24, 2018 by WIPO Google translate (Year: 2018).*
(Continued)

*Primary Examiner* — Daniel L Murphy
(74) *Attorney, Agent, or Firm* — Drinker Biddle & Reath LLP

(57) ABSTRACT

In a range image sensor, a plurality of range sensors are disposed in a one-dimensional direction. The plurality of range sensors include a photogate electrode, first and second signal charge accumulating regions disposed on one side of the photogate electrode, third and fourth signal charge accumulating regions disposed on the other side, first transfer electrodes for making charge flow into the first and fourth signal charge accumulating regions in response to a first transfer signal, and second transfer electrodes for making charge flow into the second and third signal charge accumulating regions in response to a second transfer signal.

3 Claims, 14 Drawing Sheets

(51) Int. Cl.
*G01S 7/491* (2006.01)
*H01L 27/146* (2006.01)
*H04N 5/3745* (2011.01)

(52) U.S. Cl.
CPC .. *H01L 27/14603* (2013.01); *H01L 27/14612* (2013.01); *H01L 27/14643* (2013.01); *H04N 5/3745* (2013.01)

(58) Field of Classification Search
USPC ....................................................... 356/5.01
See application file for complete search history.

(56) References Cited

FOREIGN PATENT DOCUMENTS

| | | | |
|---|---|---|---|
| CN | 103155150 | | 6/2013 |
| CN | 103582948 | | 2/2014 |
| EP | 2442068 | | 4/2012 |
| JP | 2007-526448 | A | 9/2007 |
| JP | 2011-112376 | A | 6/2011 |
| JP | 2011-133464 | A | 7/2011 |
| JP | 2012083213 | A * | 4/2012 |
| JP | 5460304 | | 4/2014 |
| WO | WO 02/049366 | | 6/2002 |
| WO | WO-2004/114369 | A2 | 12/2004 |
| WO | WO-2007/026779 | A1 | 3/2007 |
| WO | WO 2011/065167 | | 6/2011 |

OTHER PUBLICATIONS

International Preliminary Report on Patentability dated Oct. 27, 2016 for PCT/JP2015/061876.

* cited by examiner

RANGE IMAGE SENSOR

TECHNICAL FIELD

The present invention relates to a range image sensor.

BACKGROUND ART

There is a known TOF (Time-Of-Flight) type range image sensor (e.g., cf. Patent Literature 1). In the range image sensor described in Patent Literature 1, each of range sensors disposed in a one-dimensional direction is configured with a rectangular charge generating region, transfer electrodes provided respectively along two opposed sides of the charge generating region, and signal charge accumulating regions for respectively accumulating signal charges transferred by the transfer electrodes.

In this range image sensor, the transfer electrodes distribute charge generated in the charge generating region, as the signal charges to the respective signal charge accumulating regions in response to transfer signals of different phases. The distributed signal charges are respectively accumulated in the corresponding signal charge accumulating regions. The signal charges accumulated in the respective signal charge accumulating regions are read out as outputs corresponding to quantities of the accumulated charges. A range to an object is calculated based on a ratio of these outputs.

CITATION LIST

Patent Literature

Patent Literature 1: International Publication WO2007/026779

SUMMARY OF INVENTION

Technical Problem

If, in the charge distribution type range image sensor where the plurality of range sensors are disposed in the one-dimensional direction, crosstalk (leakage) of charges occurs between range sensors adjacent in the one-dimensional direction, effects of the crosstalk of charges on range measurement might be different between the adjacent range sensors. When the effects of the crosstalk of charges on the range measurement are different between the adjacent range sensors, it becomes difficult to carry out the range measurement appropriately.

An object of one aspect of the present invention is to provide a charge distribution type range image sensor, the range image sensor causing the same effects of the crosstalk of charges on the range measurement between the range sensors adjacent in the one-dimensional direction.

Solution to Problem

The inventors conducted research and study on the charge distribution type range image sensor which caused the same effects of the crosstalk of charges on the range measurement between the range sensors adjacent in the one-dimensional direction. As a result, the inventors have found the following facts.

In the range image sensor as described in the foregoing Patent Literature 1, a signal may be detected by another range sensor different from one onto which light is incident (which will be referred to hereinafter as incident range sensor). This is considered to be caused by occurrence of such crosstalk that charge generated in the charge generating region of the incident range sensor flows into each of the signal charge accumulating regions of the other range sensor. Effects of the crosstalk on the respective signal charge accumulating regions of the other range sensor are different depending on dispositions of the respective signal charge accumulating regions. Particularly, the effect is significantly different depending on whether the disposition of each signal charge accumulating region in the other range sensor is on the incident range sensor side or not. Namely, the effect of the crosstalk is greater on the signal charge accumulating region disposed on the light-incident range sensor side in the other range sensor, while the effect of the crosstalk is smaller on the signal charge accumulating region disposed on the side opposite to the light-incident range sensor side.

In the charge distribution type range sensor, as described above, the range to the object is calculated based on the ratio of the outputs from the respective signal charge accumulating regions. For this reason, if there are leakages of charges from the neighboring range sensor to the respective signal charge accumulating regions, the calculated range will vary. For example, even if, in the signal charge accumulating regions of two range sensors where light is incident, quantities of charges distributed in response to a transfer signal of one phase and quantities of charges distributed in response to the other phase should be identical, measured ranges could be different because of the difference of the effects of the crosstalk. Specifically, even in a situation where two light-incident range sensors should obtain the same measured range, the range sensors can yield different measured ranges if the dispositions of the respective signal charge accumulating regions to accumulate signal charges in response to the transfer signals of the same phase are different from each other, depending on whether each region is located on the other light-incident range sensor side or not.

The inventors, focusing attention on these facts found by ourselves, conducted further intensive research on a configuration to equalize the effects of the crosstalk of charges on the range measurement between the range sensors adjacent in the one-dimensional direction and came to accomplish the present invention.

A range image sensor according to one aspect of the present invention is a range image sensor in which a plurality of range sensors are disposed in a one-dimensional direction, wherein each of the plurality of range sensors includes: a charge generating region where charge is generated according to incident light; first and second signal charge accumulating regions disposed away from the charge generating region on one side in the one-dimensional direction of the charge generating region and away from each other along a direction perpendicular to the one-dimensional direction, and configured to accumulate the charge generated in the charge generating region, as signal charges; a third signal charge accumulating region disposed away from the charge generating region on the other side in the one-dimensional direction of the charge generating region and opposite to the first signal charge accumulating region with the charge generating region in between in the one-dimensional direction, and configured to accumulate the charge generated in the charge generating region, as a signal charge; a fourth signal charge accumulating region disposed away from the charge generating region on the other side in the one-dimensional direction of the charge generating region and opposite to the second signal charge accumulating region with the charge generating region in between in the one-dimensional direction, and configured to accumulate the charge generated in the charge generating region, as a signal charge; two first transfer electrodes disposed respectively between the first and fourth signal charge accumulating regions and the charge generating region and configured to make the charge generated in the charge generating region, flow as the signal charges into the first and fourth signal charge accumulating regions in response to a first transfer signal; and two second transfer electrodes disposed respectively between the second and third signal charge accumulating regions and the charge generating region and configured to make the charge generated in the charge generating region, flow as the signal charges into the second and third signal charge accumulating regions in response to a second transfer signal different in phase from the first transfer signal, and wherein in any two range sensors adjacent in the one-dimensional direction, the first signal charge accumulating region and the fourth signal charge accumulating region are adjacent in the one-dimensional direction and, the second signal charge accumulating region and the third signal charge accumulating region are adjacent in the one-dimensional direction.

In this aspect, the plurality of range sensors are disposed in the one-dimensional direction. Each of the plurality of range sensors includes the first and second signal charge accumulating regions on the one side in the one-dimensional direction of the charge generating region and includes the third and fourth signal charge accumulating regions on the other side of the charge generating region. The first and fourth signal charge accumulating regions accumulate the signal charges made to flow in response to the first transfer signal. The second and third signal charge accumulating regions accumulate the signal charges made to flow in response to the second transfer signal. Namely, in each of the plurality of range sensors, the signal charge accumulating regions to accumulate the signal charges made to flow in response to the first transfer signal are disposed respectively on both sides in the one-dimensional direction of the charge generating region and the signal charge accumulating regions to accumulate the signal charges made to flow in response to the second transfer signal are disposed respectively on both sides in the one-dimensional direction of the charge generating region. For this reason, in each of the plurality of range sensors, charges leaking from another range sensor are distributed with a good balance into the signal charge accumulating regions to accumulate the signal charges made to flow in response to the first transfer signal and into the signal charge accumulating regions to accumulate the signal charges made to flow in response to the second transfer signal. Therefore, the effects of crosstalk of the charges on the range measurement become identical between the range sensors adjacent in the one-dimensional direction.

In this aspect, the sensor may include a plurality of unnecessary charge collecting regions disposed away from the charge generating region on the one side and on the other side in the one-dimensional direction of the charge generating region and configured to collect the charge generated in the charge generating region, as unnecessary charges; and a plurality of third transfer electrodes disposed respectively between the plurality of unnecessary charge collecting regions and the charge generating region and configured to make the charge generated in the charge generating region, flow as the unnecessary charges into the plurality of unnecessary charge collecting regions in response to a third transfer signal different in phase from the first and second transfer signals. In this case, since the unnecessary charges can be discharged to the outside, the measurement accuracy of range can be improved.

In this aspect, the sensor may include a plurality of unnecessary charge collecting regions disposed with the charge generating region in between in the direction perpendicular to the one-dimensional direction and away from the charge generating region and configured to collect the charge generated in the charge generating region, as unnecessary charges; and a plurality of third transfer electrodes disposed respectively between the plurality of unnecessary charge collecting regions and the charge generating region and configured to make the charge generated in the charge generating region, flow as the unnecessary charges into the plurality of unnecessary charge collecting regions in response to a third transfer signal different in phase from the first and second transfer signals. In this case, since the unnecessary charges can be discharged to the outside, the measurement accuracy of range can be improved.

Advantageous Effects of Invention

According to the above-described aspect of the present invention, the charge distribution type range image sensor can be provided as the range image sensor that causes the same effects of the crosstalk of charges on the range measurement between the range sensors adjacent in the one-dimensional direction.

DESCRIPTION OF EMBODIMENTS

An embodiment of the present invention will be described below in detail with reference to the drawings. It should be noted that in the description the same elements or elements with the same functionality will be denoted by the same reference signs, without redundant description.

Figure 1:
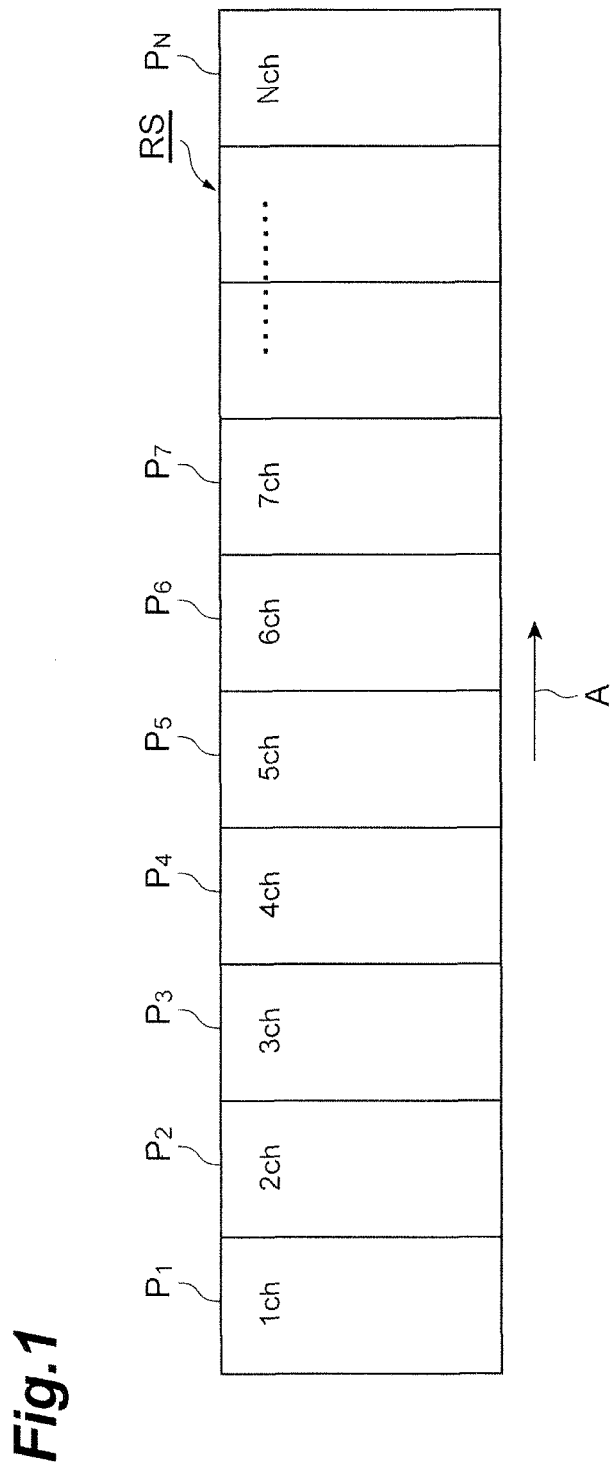
FIG. 1 is a configuration diagram of a range image sensor according to one embodiment of the present invention.

FIG. 1 is a configuration diagram of the range image sensor according to the present embodiment.

The range image sensor RS is a line sensor with an array structure in which a plurality of range sensors $P_1$ to $P_N$ (where N is a natural number not less than 2) are disposed in a one-dimensional direction A. Each one or each two or more of the plurality of range sensors $P_1$ to $P_N$ constitute one pixel of the range image sensor RS. In the present embodiment, each one of the range sensors $P_1$ to $P_N$ constitutes one pixel of the range image sensor RS.

Figure 2:
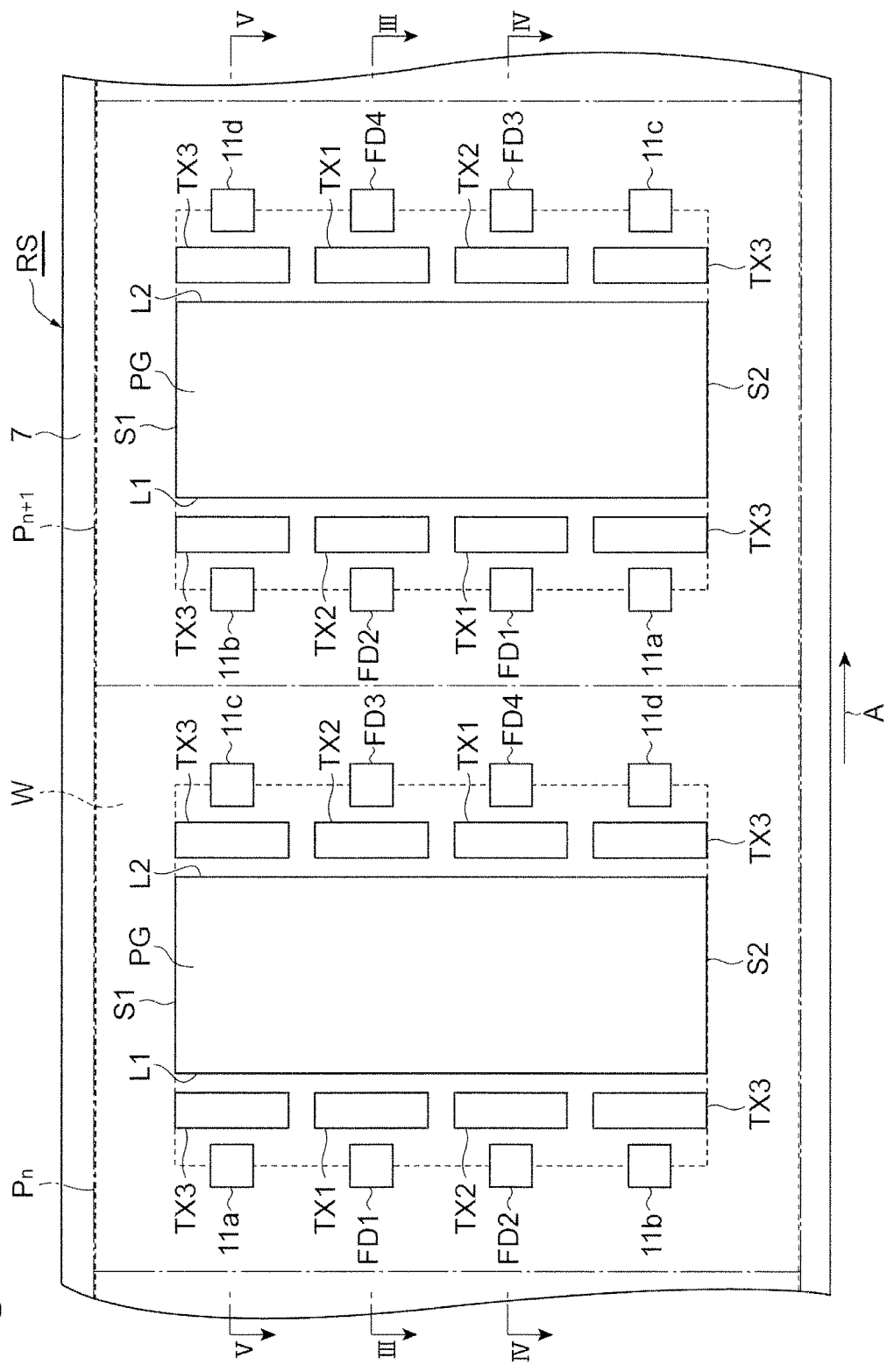
FIG. 2 is a schematic plan view showing a part of an imaging area in the range image sensor of FIG. 1.
Figure 3:
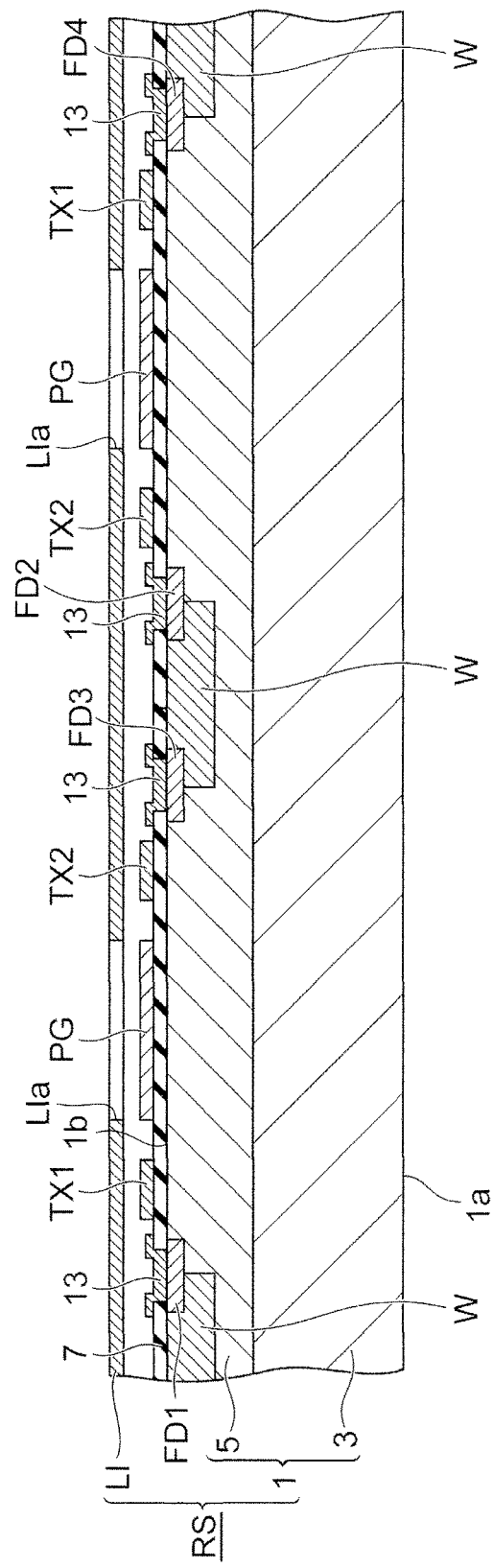
FIG. 3 is a drawing showing a cross-sectional configuration along the line III-III in FIG. 2.
Figure 4:
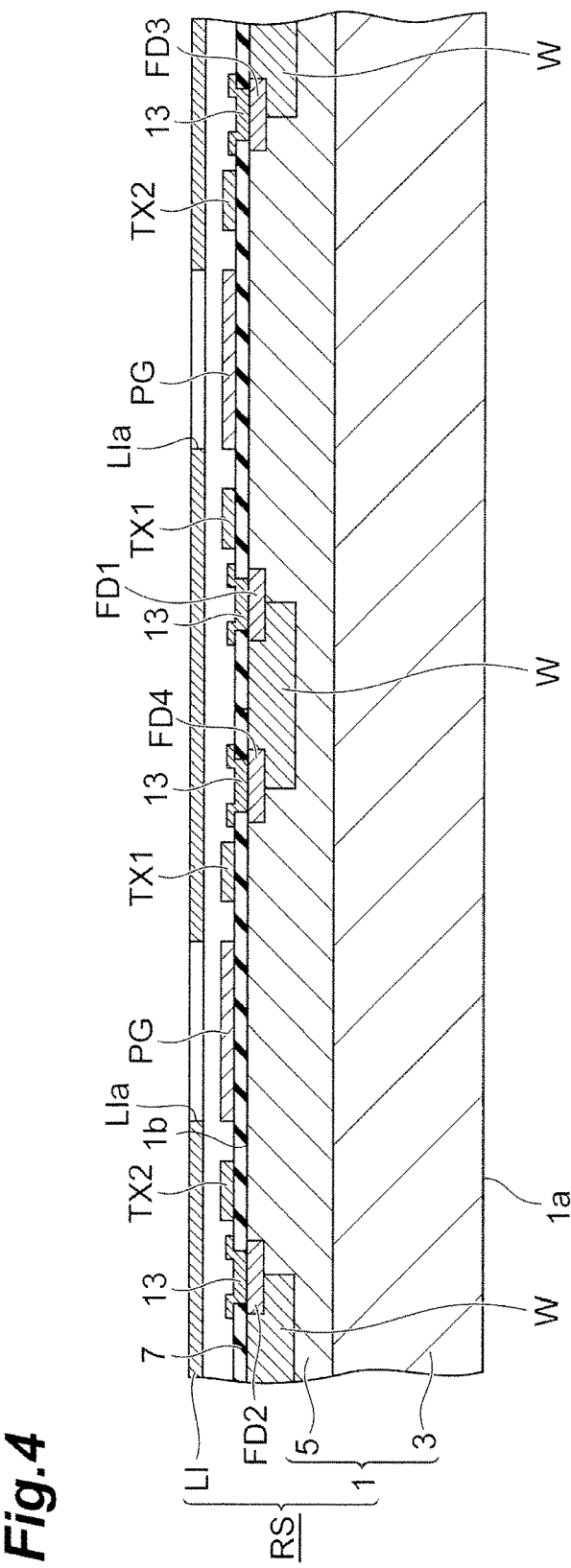
FIG. 4 is a drawing showing a cross-sectional configuration along the line IV-IV in FIG. 2.
Figure 5:
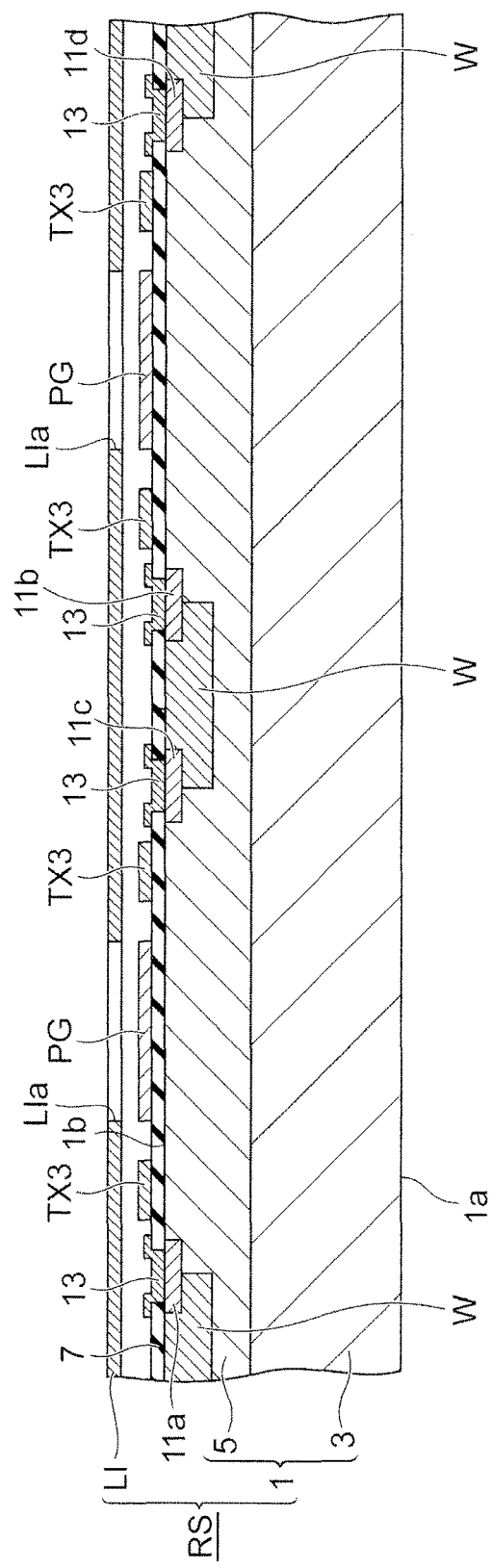
FIG. 5 is a drawing showing a cross-sectional configuration along the line V-V in FIG. 2.

FIG. 2 is a schematic plan view showing a part of an imaging area in the range image sensor of FIG. 1. FIG. 3 is a drawing showing a cross-sectional configuration along the line III-III in FIG. 2. FIG. 4 is a drawing showing a cross-sectional configuration along the line IV-IV in FIG. 2, FIG. 5 is a drawing showing a cross-sectional configuration along the line V-V in FIG. 2. FIGS. 2 to 5, particularly, show adjacent two range sensors $P_n$, $P_{n+1}$ (where n is a natural number not more than N−1).

The range image sensor RS is a front-illuminated range image sensor which includes a semiconductor-substrate 1 with first and second principal surfaces 1a, 1b opposed to each other. The second principal surface 1b is a light-incident surface. The range image sensor RS includes a light interception layer LI in front of the second principal surface 1b being the light-incident surface. In the light interception layer LI, apertures LIa are formed in the one-dimensional direction A, in respective regions corresponding to the plurality of range sensors $P_1$ to $P_N$. The apertures LIa are of a rectangular shape. In the present embodiment, the apertures are shaped in a rectangle. Light passes through the apertures LIa of the light interception layer LI to enter the semiconductor substrate 1. Therefore, the apertures LIa define light receiving regions in the semiconductor substrate 1. The light interception layer LI is includes, for example, metal such as aluminum.

The semiconductor substrate 1 includes a p-type first semiconductor region 3 located on the first principal surface 1a side and a p$^-$-type second semiconductor region 5 having a lower impurity concentration than the first semiconductor region 3 and located on the second principal surface 1b side. The semiconductor substrate 1 can be obtained, for example, by growing, on a p-type semiconductor substrate, a p$^-$-type epitaxial layer with a lower impurity concentration than the semiconductor substrate. An insulating layer 7 is formed on the second principal surface 1b (second semiconductor region 5) of the semiconductor substrate 1.

The plurality of range sensors $P_1$ to $P_N$ are disposed in the one-dimensional direction A on the insulating layer 7. Each of the plurality of range sensors $P_1$ to $P_N$ includes a photogate electrode PG, a first signal charge accumulating region FD1, a second signal charge accumulating region FD2, a third signal charge accumulating region FD3, a fourth signal charge accumulating region FD4, two first transfer electrodes TX1, two second transfer electrodes TX2, four unnecessary charge collecting regions 11a to 11d, four third transfer electrodes TX3, and a p-type well region W. FIG. 2 is drawn without illustration of conductors 13 (cf. FIGS. 3 to 5) disposed on the first to fourth signal charge accumulating regions FD1-FD4.

The photogate electrode PG is disposed corresponding to the aperture LIa. A region corresponding to the photogate electrode PG in the semiconductor substrate 1 (second semiconductor region 5) (which is the region located below the photogate electrode PG in FIGS. 3 to 5) functions as a charge generating region where charge is generated according to incident light. The photogate electrode PG also corresponds to the shape of the aperture LIa and is of a rectangular shape on the plan view. In the present embodiment, the photogate electrode PG is shaped in a rectangle as the aperture LIa is. Namely, the photogate electrode PG has a planar shape with first and second long sides L1, L2 perpendicular to the one-dimensional direction A and opposed to each other and with first and second short sides S1, S2 parallel to the one-dimensional direction A and opposed to each other. The photogate electrode PG has the first long side L1 on one side in the one-dimensional direction A and the second long side L2 on the other side in the one-dimensional direction A.

The first and second signal charge accumulating regions FD1, FD2 are disposed away from the photogate electrode PG on the first long side L1 side of the photogate electrode PG (on the one side in the one-dimensional direction A) and away from each other along a direction perpendicular to the one-dimensional direction A. The third and fourth signal charge accumulating regions FD3, FD4 are disposed away from the photogate electrode PG on the second long side L2 side of the photogate electrode PG (on the other side in the one-dimensional direction A) and away from each other along the direction perpendicular to the one-dimensional direction A.

Namely, the third signal charge accumulating region FD3 is disposed opposite to the first signal charge accumulating region FD1 with the photogate electrode PG in between in the one-dimensional direction A. The fourth signal charge accumulating region FD4 is disposed opposite to the second signal charge accumulating region FD2 with the photogate electrode PG in between in the one-dimensional direction A. The first to fourth signal charge accumulating regions FD1-FD4 are n-type semiconductor regions with a high impurity concentration formed in the second semiconductor region 5 and are configured to accumulate the charge generated in the charge generating region, as signal charges.

The unnecessary charge collecting regions 11a, 11b are disposed away from the photogate electrode PG on the first long side L1 side of the photogate electrode PG and opposite to each other with the first and second signal charge accumulating regions FD1, FD2 in between along the direction perpendicular to the one-dimensional direction A. Along the direction perpendicular to the one-dimensional direction A, the unnecessary charge collecting region 11a is adjacent to the first signal charge accumulating region FD1, and the unnecessary charge collecting region 11b is adjacent to the second signal charge accumulating region FD2.

The unnecessary charge collecting regions 11c, 11d are disposed away from the photogate electrode PG on the second long side L2 side of the photogate electrode PG and opposite to each other with the third and fourth signal charge accumulating regions FD3, FD4 in between along the direction perpendicular to the one-dimensional direction A. Along the direction perpendicular to the one-dimensional direction A, the unnecessary charge collecting region 11c is adjacent to the third signal charge accumulating region FD3, and the unnecessary charge collecting region 11d is adjacent to the fourth signal charge accumulating region FD4. The unnecessary charge collecting regions 11a, 11c are disposed opposite to each other with the photogate electrode PG in between in the one-dimensional direction A. The unnecessary charge collecting regions 11b, 11d are disposed opposite to each other with the photogate electrode PG in between in the one-dimensional direction A.

The unnecessary charge collecting regions 11a-11d are n-type semiconductor regions with a high impurity concentration formed in the second semiconductor region 5 and are configured to collect the charge generated in the charge generating region, as unnecessary charges.

The well region W, when viewed from a direction perpendicular to the second principal surface 1b, is formed in the second semiconductor region 5 to surround the photogate electrode PG, the first and second transfer electrodes TX1, TX2, and the first to fourth signal charge accumulating regions FD1-FD4. The well region W, when viewed from the direction perpendicular to the second principal surface 1b, overlaps a part of each of the first to fourth signal charge accumulating regions FD1-FD4. The outer edges of the well regions W are approximately coincident with the outer edges of the plurality of range sensors $P_1$ to $P_N$. The well region W has the same conductivity type as that of the second semiconductor region 5 and has a higher impurity concentration than the second semiconductor region 5. The well region W inhibits depletion layers spreading with application of a voltage to the photogate electrode PG from being coupled to depletion layers spreading from the first to fourth signal charge accumulating regions FD1 to FD4. This suppresses crosstalk.

The first and second signal charge accumulating regions FD1, FD2 and the unnecessary charge collecting regions 11a, 11b are disposed away from each other along the direction perpendicular to the one-dimensional direction A, on the first long side L1 side of the photogate electrode PG. The third and fourth signal charge accumulating regions FD3, FD4 and the unnecessary charge collecting regions 11c, 11d are disposed away from each other along the direction perpendicular to the one-dimensional direction A, on the second long side L2 side of the photogate electrode PG. The first to fourth signal charge accumulating regions FD1-FD4 and the unnecessary charge collecting regions 11a-11d are of a rectangular shape on the plan view. In the present embodiment, the first to fourth signal charge accumulating regions FD1-FD4 and the unnecessary charge collecting regions 11a-11d are of a square shape on the plan view and are identical in shape with each other.

The range sensor $P_n$ and the range sensor $P_{n+1}$ are disposed one at an even-numbered position and the other at an odd-numbered position. Namely, in the range image sensor RS, the range sensors $P_n$ and $P_{n+1}$ are alternately disposed in the one-dimensional direction A.

The range sensor $P_n$ and the range sensor $P_{n+1}$ are different only in alignment sequence of the first to fourth signal charge accumulating regions FD1-FD4 and the unnecessary charge collecting regions 11a-11d and in alignment sequence of the first to third transfer electrodes TX1-TX3. Namely, on the first long side L1 side of the photogate electrode PG, the unnecessary charge collecting region 11a, first signal charge accumulating region FD1, second signal charge accumulating region FD2, and unnecessary charge collecting region 11b are disposed in this order from the first short side S1 side in the range sensor $P_n$, while they are disposed in this order from the second short side S2 side in the range sensor $P_{n+1}$. On the long side L2 side of the photogate electrode PC; the unnecessary charge collecting region 11c, third signal charge accumulating region FD3, fourth signal charge accumulating region FD4, and unnecessary charge collecting region 11d are disposed in this order from the first short side S1 side in the range sensor $P_n$, while they are disposed in this order from the second short side S2 side in the range sensor $P_{n+1}$.

On the first long side L1 side of the photogate electrode PG, the third transfer electrode TX3, first transfer electrode TX1, second transfer electrode TX2, and third transfer electrode TX3 are disposed in this order from the first short side S1 side in the range sensor $P_n$, while they are disposed in this order from the second short side S2 side in the range sensor $P_{n+1}$. On the long side L2 side of the photogate electrode PG, the third transfer electrode TX3, second transfer electrode TX2, first transfer electrode TX1, and third transfer electrode TX3 are disposed in this order from the first short side S1 side in the range sensor $P_n$, while they are disposed in this order from the second short side S2 side in the range sensor $P_{n+1}$.

The fourth signal charge accumulating region FD4 of the range sensor $P_n$ and the first signal charge accumulating region FD1 of the range sensor $P_{n+1}$ are adjacent in the one-dimensional direction A. The third signal charge accumulating region FD3 of the range sensor $P_n$ and the second signal charge accumulating region FD2 of the range sensor $P_{n+1}$ are adjacent in the one-dimensional direction A. In the range image sensor RS, as described above, the first signal charge accumulating region FD1 and the fourth signal charge accumulating region FD4 are adjacent in the one-dimensional direction A and, the second signal charge accumulating region FD2 and the third signal charge accumulating region FD3 are adjacent in the one-dimensional direction A, in two range sensors $P_n$ and $P_{n+1}$ adjacent in the one-dimensional direction A.

In the present embodiment, "impurity concentration is high" indicates that the impurity concentration is, for example, not less than about $1 \times 10^{17}$ cm$^{-3}$, which is indicated by "+" attached to conductivity type. On the other hand, "impurity concentration is low" indicates that the impurity concentration is, for example, not more than about $10 \times 10^{15}$ cm$^{-3}$, which is indicated by "−" attached to conductivity type.

The thicknesses/impurity concentrations of the respective semiconductor regions are as described below.

First semiconductor region 3: thickness 10 to 1000 μm/impurity concentration $1 \times 10^{12}$ to $10^{19}$ cm$^{-3}$
Second semiconductor region 5: thickness 1 to 50 μm/impurity concentration $1 \times 10^{12}$ to $10^{15}$ cm$^{-3}$
First to fourth signal charge accumulating regions FD1-FD4 and unnecessary charge collecting regions 11a-11d: thickness 0.1 to 1 μm/impurity concentration $1 \times 10^{18}$ to $10^{20}$ cm$^{-3}$
Well regions W: thickness 0.5 to 5 μm/impurity concentration $1 \times 10^{16}$ to $10^{18}$ cm$^{-3}$ The semiconductor substrate 1 (first and second semiconductor regions 3, 5) is given a reference potential such as the ground potential through a back gate or a through-via electrode or the like.

The first transfer electrodes TX1 are disposed on the insulating layer 7 and respectively between the first and fourth signal charge accumulating regions FD1, FD4 and the photogate electrode PG. The first transfer electrodes TX1 are disposed respectively away from the first and fourth signal charge accumulating regions FD1, FD4 and the photogate electrode PG. The first transfer electrodes TX1 make the charge generated in the charge generating region, flow as signal charges into the first and fourth signal charge accumulating regions FD1, FD4 in response to a first transfer signal $S_1$ (cf. FIG. 9).

The second transfer electrodes TX2 are disposed on the insulating layer 7 and respectively between the second and third signal charge accumulating regions FD2, FD3 and the photogate electrode PG. The second transfer electrodes TX2 are disposed respectively away from the second and third signal charge accumulating regions FD2, FD3 and the photogate electrode PG. The second transfer electrodes TX2 make the charge generated in the charge generating region, flow as signal charges into the second and third signal charge accumulating regions FD2, FD3 in response to a second transfer signal $S_2$ (cf. FIG. 9) different in phase from the first transfer signal $S_1$.

The third transfer electrodes TX3 are disposed on the insulating layer 7 and respectively between the unnecessary charge collecting regions 11a-11d and the photogate electrode PG. The third transfer electrodes TX3 are disposed respectively away from the unnecessary charge collecting regions 11a-11d and the photogate electrode PG. The third transfer electrodes TX3 make the charge generated in the charge generating region, flow as unnecessary charges into the unnecessary charge collecting regions 11a-11d in response to a third transfer signal $S_3$ (cf. FIG. 11) different in phase from the first transfer signal $S_1$ and the second transfer signal $S_2$.

The first to third transfer electrodes TX1-TX3 are disposed away from each other along the direction perpendicular to the one-dimensional direction A, on the first long side L1 side and on the second long side L2 side of the photogate electrode PG. The first to third transfer electrodes TX1-TX3 are of a rectangular shape on the plan view. In the present embodiment, the first to third transfer electrodes TX1-TX3 are shaped in a rectangle with long sides along the direction perpendicular to the one-dimensional direction A and are identical in shape with each other. The length of the long sides of the first to third transfer electrodes TX1-TX3 is equal approximately to the length of a quarter of the first long side L1 of the photogate electrode PG, for example.

The insulating layer 7 is provided with contact holes for exposing the surface of the second semiconductor region 5. The conductors 13 are disposed in the contact holes. The conductors 13 connect the first to fourth signal charge accumulating regions FD1-FD4 and the unnecessary charge collecting regions 11a-11d to the outside.

The semiconductor substrate includes Si, the insulating layer 7 of $SiO_2$, and, the photogate electrodes PG and first to third transfer electrodes TX1-TX3 of polysilicon, but these may be made using other materials.

There is a 180° shift between the phase of the first transfer signal $S_1$ applied to the first transfer electrodes TX1 and the phase of the second transfer signal $S_2$ applied to the second transfer electrodes TX2. Light incident onto each of the range sensors $P_1$ to $P_N$ is converted into charge in the semiconductor substrate 1 (second semiconductor region 5). Part of the charge generated in this manner migrates as signal charges in the directions toward the first transfer electrodes TX1 or toward the second transfer electrodes TX2, i.e., in the directions parallel to the first and second short sides S1, S2 of the photogate electrode PG in accordance with potential gradients established by a voltage applied to the photogate electrode PG and the first and second transfer electrodes TX1, TX2.

When the first or second transfer electrodes TX1, TX2 are given a positive potential, a potential below the first or second transfer electrodes TX1, TX2 becomes lower than that of the semiconductor substrate 1 (second semiconductor region 5) in the portion below the photogate electrode PG with respect to electrons and negative charges (electrons) are drawn in the directions toward the first or second transfer electrodes TX1, TX2 to be accumulated in potential wells faulted by the first to fourth signal charge accumulating regions FD1-FD4. An n-type semiconductor contains positively-ionized donors and has a positive potential, to attract electrons. When the first or second transfer electrodes TX1, TX2 are given a potential lower than the foregoing positive potential (e.g., the ground potential), a potential barrier is made by the first or second transfer electrodes TX1, TX2 and the charge generated in the semiconductor substrate 1 is not drawn into the first to fourth signal charge accumulating regions FD1-FD4.

Part of the charge generated with incidence of light into each of the plurality of range sensors $P_1$ to $P_N$ migrates as unnecessary charges in the directions toward the third transfer electrodes TX3 in accordance with a potential gradient established by a voltage applied to the photogate electrode PG and the third transfer electrodes TX3.

When the third transfer electrodes TX3 are given a positive potential, a potential below the third transfer electrodes TX3 becomes lower than that of the semiconductor substrate 1 (second semiconductor region 5) in the portion below the photogate electrode PG with respect to electrons and negative charges (electrons) are drawn in the directions toward the third transfer electrodes TX3, to be collected in potential wells formed by the unnecessary charge collecting regions 11a-11d. When the third transfer electrodes TX3 are given a potential lower than the aforementioned positive potential (e.g., the ground potential), a potential barrier is made by the third transfer electrodes TX3 and the charge generated in the semiconductor substrate 1 is not drawn into the unnecessary charge collecting regions 11a-11d.

Figure 6:
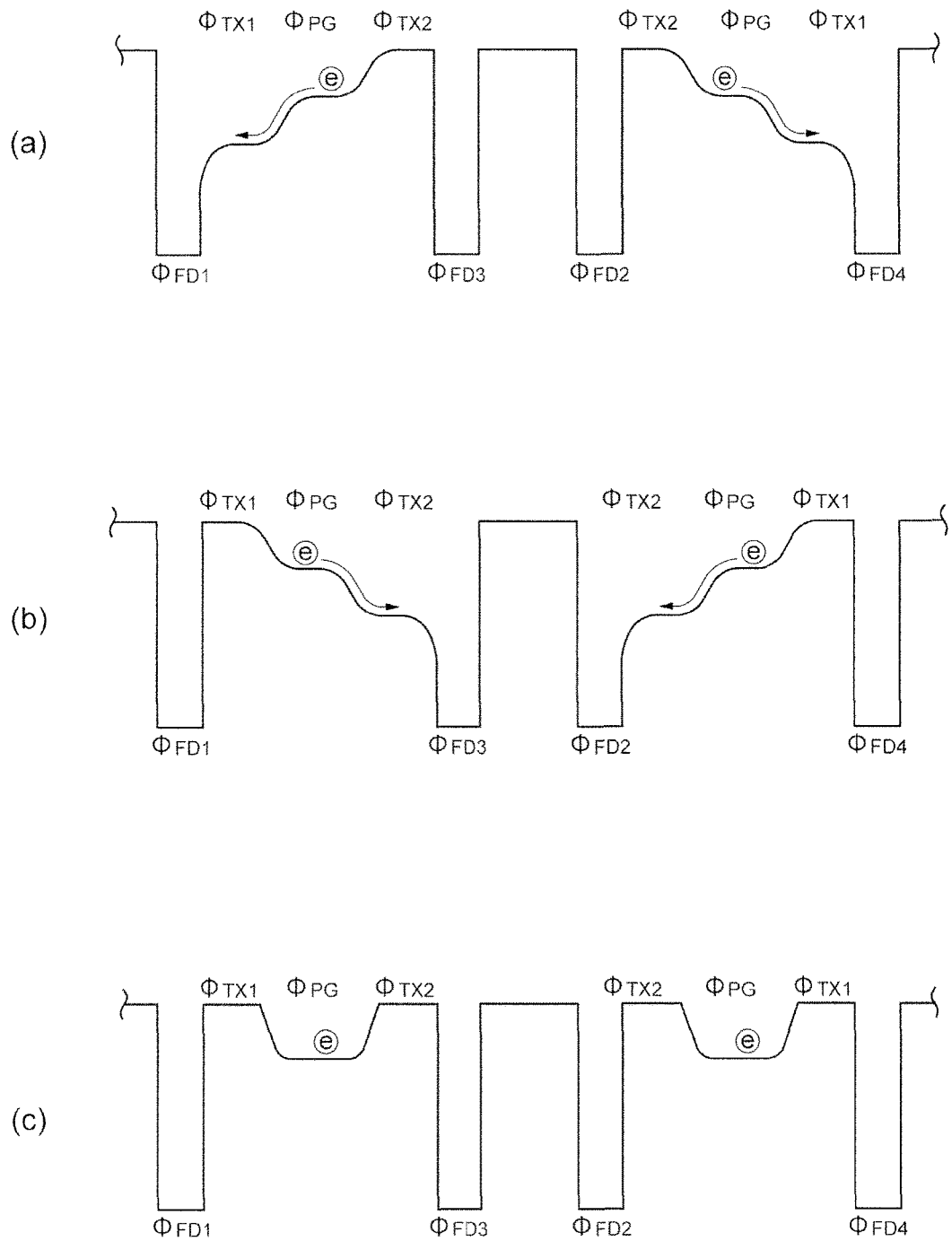
FIG. 6 is a drawing showing potential profiles in the vicinity of a second principal surface of a semiconductor substrate.
Figure 7:
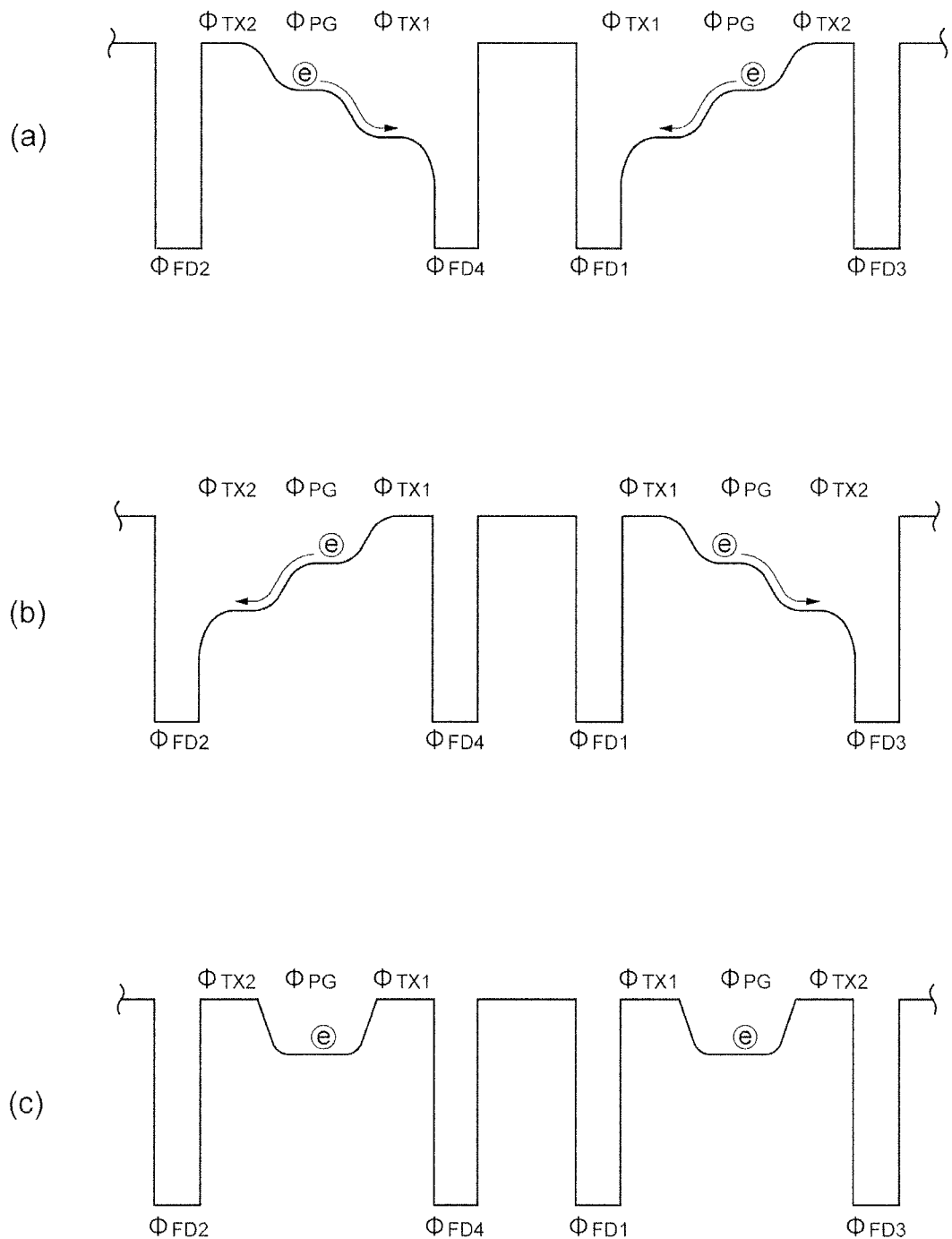
FIG. 7 is a drawing showing potential profiles in the vicinity of the second principal surface of the semiconductor substrate.
Figure 8:
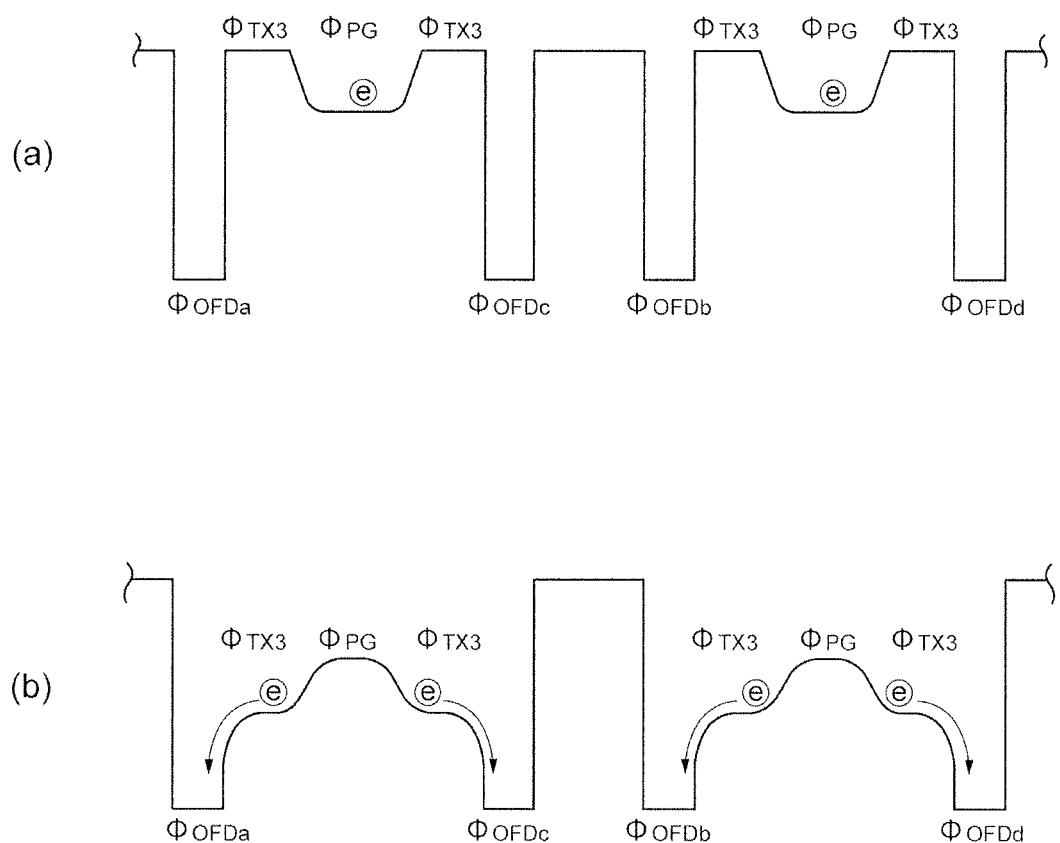
FIG. 8 is a drawing showing potential profiles in the vicinity of the second principal surface of the semiconductor substrate.

FIG. 6 is a drawing showing potential profiles in the vicinity of the second principal surface of the semiconductor substrate along the line III-III in FIG. 2. FIG. 7 is a drawing showing potential profiles in the vicinity of the second principal surface of the semiconductor substrate along the line IV-IV in FIG. 2. FIG. 8 is a drawing showing potential profiles in the vicinity of the second principal surface of the semiconductor substrate along the line V-V in FIG. 2. In FIGS. 6 to 8, the downward direction is the positive direction of potential. FIGS. 6(a), (b), FIGS. 7(a), (b), and FIG. 8(a) are drawings for explaining an operation to accumulate signal charges. FIG. 6(c), FIG. 7(c), and FIG. 8(b) are drawings for explaining an operation to discharge unnecessary charges.

FIGS. 6 to 8 show a potential $\varphi_{TX1}$ of the regions immediately below the first transfer electrodes TX1, a potential $\varphi_{TX2}$ of the regions immediately below the second transfer electrodes TX2, a potential $\varphi_{TX3}$ of the regions immediately below the third transfer electrodes TX3, a potential $\varphi_{PG}$ of the charge generating region immediately below the photogate electrode PG, a potential $\varphi_{FD1}$ of the first signal charge accumulating region FD1, a potential $\varphi_{FD2}$ of the second signal charge accumulating region FD2, a potential $\varphi_{FD3}$ of the third signal charge accumulating region FD3, a potential $P_{FD4}$ of the fourth signal charge accumulating region FD4, a potential $\varphi_{OFDa}$ of the unnecessary charge collecting region 11a, a potential $P_{OFDb}$ of the unnecessary charge collecting region 11b, a potential $\varphi_{OFDc}$ of the unnecessary charge collecting region 11c, and a potential $\varphi_{OFDd}$ of the unnecessary charge collecting region 11d.

When the potential ($\varphi_{TX1}$, $\varphi_{TX2}$, $\varphi_{TX3}$) of the regions immediately below the adjacent first to third transfer electrodes TX1-TX3 with no bias is defined as a reference potential, the potential $\varphi_{PG}$ of the region immediately below the photogate electrode PG is set higher than this reference potential. This potential $\varphi_{PG}$ of the charge generating region becomes higher than the potential $\varphi_{TX1}$, $\varphi_{TX2}$, $\varphi_{TX3}$ and thus the potential profiles have a concave shape in the drawing in the charge generating region.

The accumulating operation of signal charges will be described with reference to FIGS. 6(a), (b), FIGS. 7(a), (b), and FIG. 8(a).

When the phase of the first transfer signal $S_1$ applied to the first transfer electrodes TX1 is 0 degree, the first transfer electrodes TX1 are given a positive potential. The second transfer electrodes TX2 are given a potential in the opposite phase, that is, the potential in the phase of 180 degrees (e.g., the ground potential). The photogate electrode PG is given a potential between the potential given to the first transfer electrodes TX1 and the potential given to the second transfer electrodes TX2. In this case, as shown in FIG. 6(a) and FIG. 7(a), negative charges e generated in the charge generating region flow into the potential wells of the first signal charge accumulating region FD1 and the fourth signal charge accumulating region FD4 because the potential $\varphi_{TX1}$ of the semiconductor immediately below the first transfer electrodes TX1 becomes lower than the potential $\varphi_{PG}$ of the charge generating region.

On the other hand, the potential $\varphi_{TX2}$ of the semiconductor immediately below the second transfer electrodes TX2 is not lowered and thus no charge flows into the potential wells of the second signal charge accumulating region FD2 and the third signal charge accumulating region FD3. This causes the signal charges to be collected and accumulated in the potential wells of the first signal charge accumulating region FD1 and the fourth signal charge accumulating region FD4. Since the first to fourth signal charge accumulating regions FD1-FD4 are doped with the n-type impurity, their potential is concave in the positive direction.

When the phase of the second transfer signal $S_2$ applied to the second transfer electrodes TX2 is 0 degree, the second transfer electrodes TX2 are given a positive potential, and the first transfer electrodes Txi are given a potential in the opposite phase, that is, the potential in the phase of 180 degrees (e.g., the ground potential). The photogate electrode PG is given the potential between the potential given to the first transfer electrodes TX1 and the potential given to the second transfer electrodes TX2. In this case, as shown in FIG. 6(b) and FIG. 7(b), negative charges e generated in the charge generating region flow into the potential wells of the second signal charge accumulating region FD2 and the third signal charge accumulating region FD3 because the potential $\varphi_{TX2}$ of the semiconductor immediately below the second transfer electrodes TX2 becomes lower than the potential $\varphi_{PG}$ of the charge generating region.

On the other hand, the potential $\varphi_{TX1}$ of the semiconductor immediately below the first transfer electrodes TX1 is not lowered and thus no charge flows into the potential wells of the first signal charge accumulating region FD1 and the fourth signal charge accumulating region FD4. This causes the signal charges to be collected and accumulated in the potential wells of the second signal charge accumulating region FD2 and the third signal charge accumulating region FD3.

While the first and second transfer signals $S_1$, $S_2$ with the phase shift of 180 degrees are applied to the first and second transfer electrodes TX1, TX2, the third transfer electrodes TX3 are given the ground potential. For this reason, as shown in FIG. 8(a), the potential $\varphi TX3$ of the semiconductor immediately below the third transfer electrodes TX3 is not lowered and thus no charge flows into the potential wells of the unnecessary charge collecting regions 11a-11d.

Through the above, the signal charges are collected and accumulated in the potential wells of the first to fourth signal charge accumulating regions FD1-FD4. The signal charges accumulated in the potential wells of the first to fourth signal charge accumulating regions FD1-FD4 are read out to the outside.

The discharging operation of unnecessary charges will be described with reference to FIG. 6(c), FIG. 7(c), and FIG. 8(b).

The first and second transfer electrodes TX1, TX2 are given the ground potential. For this reason, as shown in FIG. 6(c) and FIG. 7(c), the potential $\varphi_{TX1}$, $\varphi_{TX2}$ of the semiconductor immediately below the first and second transfer electrodes TX1, TX2 is not lowered and thus no charge flows into the potential wells of the first to fourth signal charge accumulating regions FD1-FD4. On the other hand, the third transfer electrodes TX3 are given a positive potential. In this case, as shown in FIG. 8(b), negative charges e generated in the charge generating region flow into the potential wells of the unnecessary charge collecting regions 11a-11d because the potential $\varphi_{TX3}$ of the semiconductor immediately below the third transfer electrodes TX3 becomes lower than the potential $\varphi_{PG}$ of the charge generating region. Through the above, the unnecessary charges are collected in the potential wells of the unnecessary charge collecting regions 11a-11d. The unnecessary charges collected in the potential wells of the unnecessary charge collecting regions 11a-11d are discharged to the outside. Namely, the unnecessary charge collecting regions 11a-11d also function as unnecessary charge discharging regions (unnecessary charge discharging drains). The unnecessary charge collecting regions 11a-11d are connected, for example, to a fixed potential.

Figure 9:
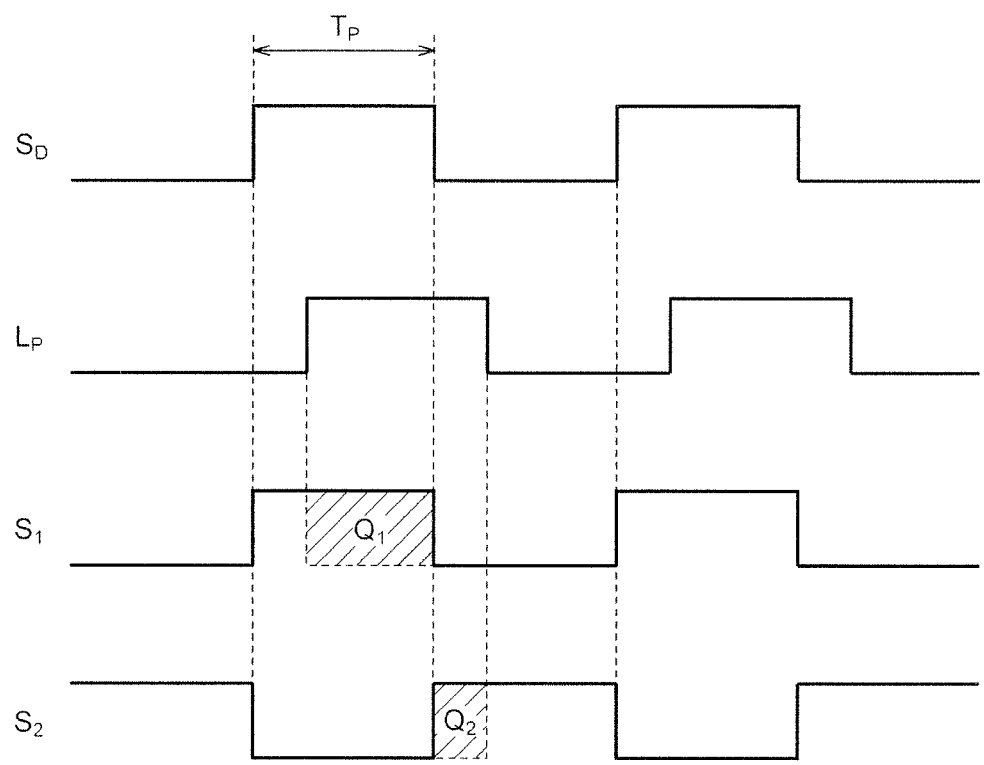
FIG. 9 is a timing chart of various signals.

FIG. 9 is a timing chart of various signals.

There are the following signals shown: a drive signal $S_D$ for below-described light source LS (cf. FIG. 12), an intensity signal $L_p$ of reflection of light emitted from the light source LS, which has returned to the imaging area after impinging upon an object OJ (cf. FIG. 12), the first transfer signal $S_1$ applied to the first transfer electrodes TX1, and, the second transfer signal $S_2$ applied to the second transfer electrodes TX2. Since the first transfer signal $S_1$ is synchronized with the drive signal $S_D$, the phase of the intensity signal $L_p$ of reflection relative to the first transfer signal $S_1$ represents the time of flight of the light, which indicates the range from the range image sensor RS to the object OJ.

An overlap between the intensity signal $L_p$ of reflection and the first transfer signal $S_1$ applied to the first transfer electrodes TX1 corresponds to a charge quantity $Q_1$ which is the sum of quantities of charges accumulated respectively in the first and fourth signal charge accumulating regions FD1, FD4. An overlap between the intensity signal $L_p$ of reflection and the second transfer signal $S_2$ applied to the second transfer electrodes TX2 corresponds to a charge quantity $Q_2$ which is the sum of quantities of charges accumulated respectively in the second and third signal charge accumulating regions FD2, FD3. In this case, the range d (cf. FIG. 12) is calculated using a ratio of the charge quantities $Q_1$, $Q_2$ collected in the first to fourth signal charge accumulating regions FD1-FD4 with application of the first and second transfer signals $S_1$, $S_2$. Namely, the range d is given by $d=(c/2)\times(T_p\times Q_2/(Q_1+Q_2))$, where $T_p$ represents a pulse width of one pulse of the drive signal $S_D$. It is noted that c represents the speed of light.

Figure 10:
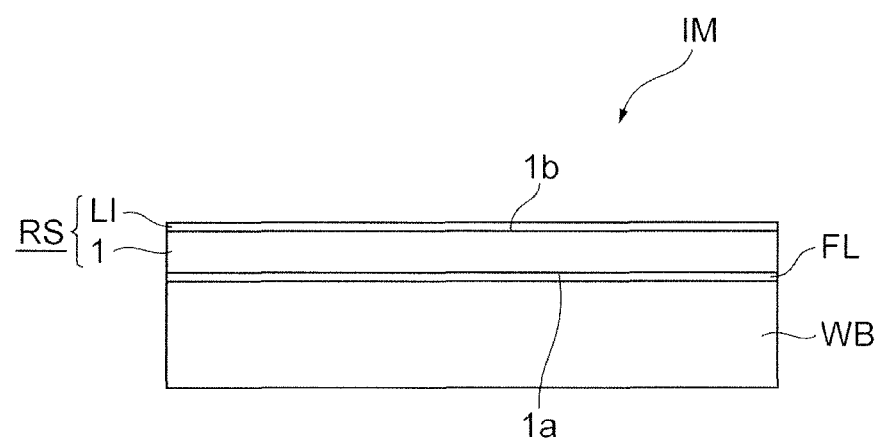
FIG. 10 is an overall cross-sectional view of an imaging device.

FIG. 10 is an overall cross-sectional view of an imaging device.

The imaging device IM includes the range image sensor RS and a wiring board WB. The range image sensor RS is bonded through an adhesive region FL to the wiring board WB in a state in which the first principal surface 1a side of the semiconductor substrate 1 is opposed to the wiring board WB. The adhesive region FL includes an insulating adhesive and a filler.

Figure 11:
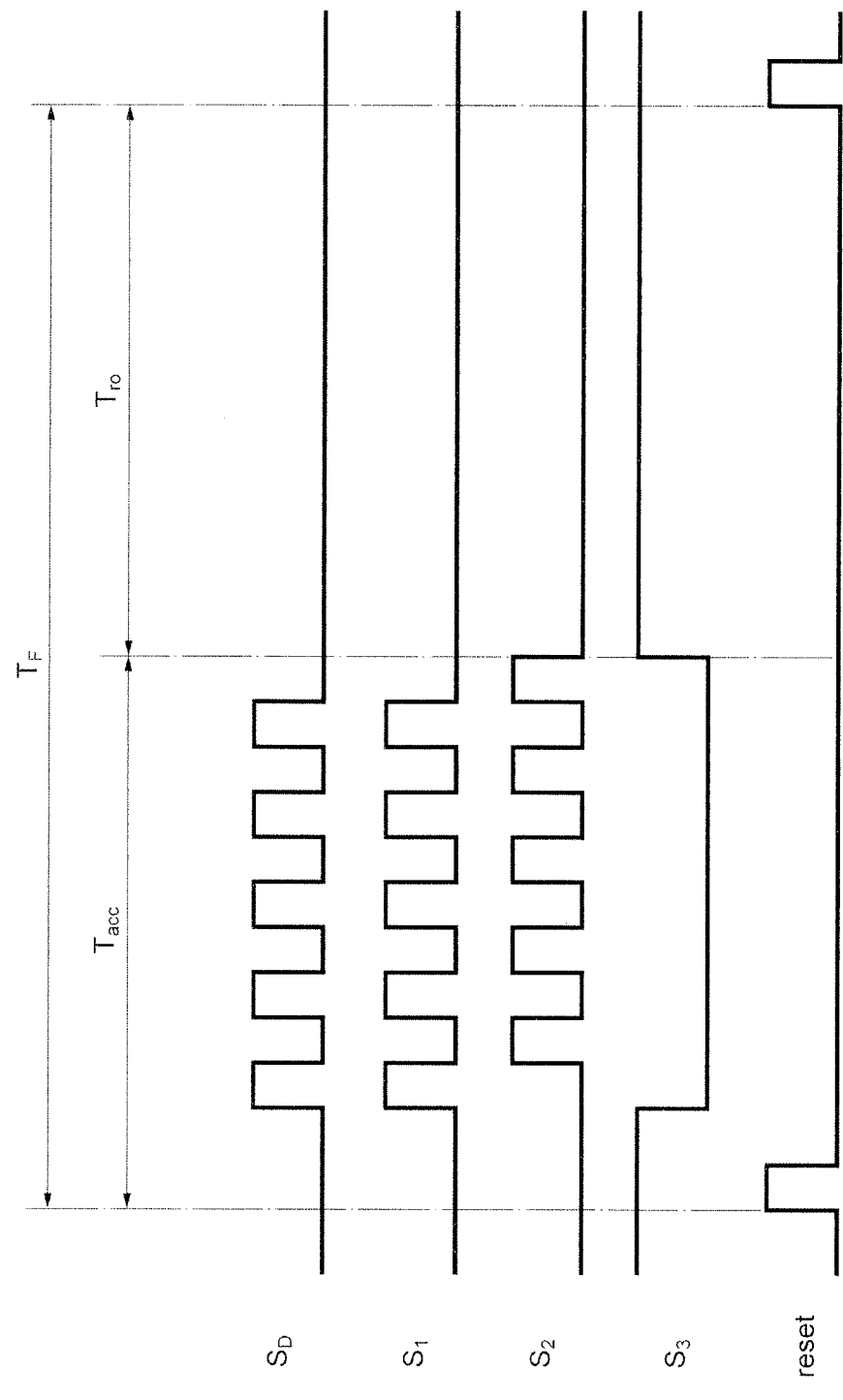
FIG. 11 is a timing chart of various signals.

FIG. 11 is a timing chart of actual various signals.

A duration $T_F$ of one frame consists of a duration (accumulation duration) $T_{acc}$ for accumulation of signal charges and a duration (readout duration) $T_{ro}$ for readout of signal charges. With attention focused on one pixel, the drive signal $S_D$ with a plurality of pulses is applied to the light source LS (cf. FIG. 12) in the accumulation duration $T_{acc}$ and, in synchronism with it, the first and second transfer signals $S_1$, $S_2$ with their respective phases opposite to each other are applied to the first and second transfer electrodes TX1, TX2. Prior to the range measurement, a reset signal reset is applied to the first to fourth signal charge accumulating regions FD1-FD4 to discharge charges accumulated inside, to the outside. In this example, the reset signal reset is momentarily turned ON and then turned OFF; thereafter, a plurality of drive signals $S_D$ are sequentially applied and, in synchronism with it, the charge transfer is sequentially carried out, whereby signal charges are integrally accumulated in the first to fourth signal charge accumulating regions FD1-FD4.

Thereafter, in the readout duration $T_{ro}$, the signal charges accumulated in the first to fourth signal charge accumulating regions FD1-FD4 are read out. At this time, the third transfer signal $S_3$ to be applied to the third transfer electrodes TX3 is turned ON to give the third transfer electrodes TX3 the positive potential, whereby unnecessary charges are collected in the potential wells of the unnecessary charge collecting regions 11a-11d.

Figure 12:
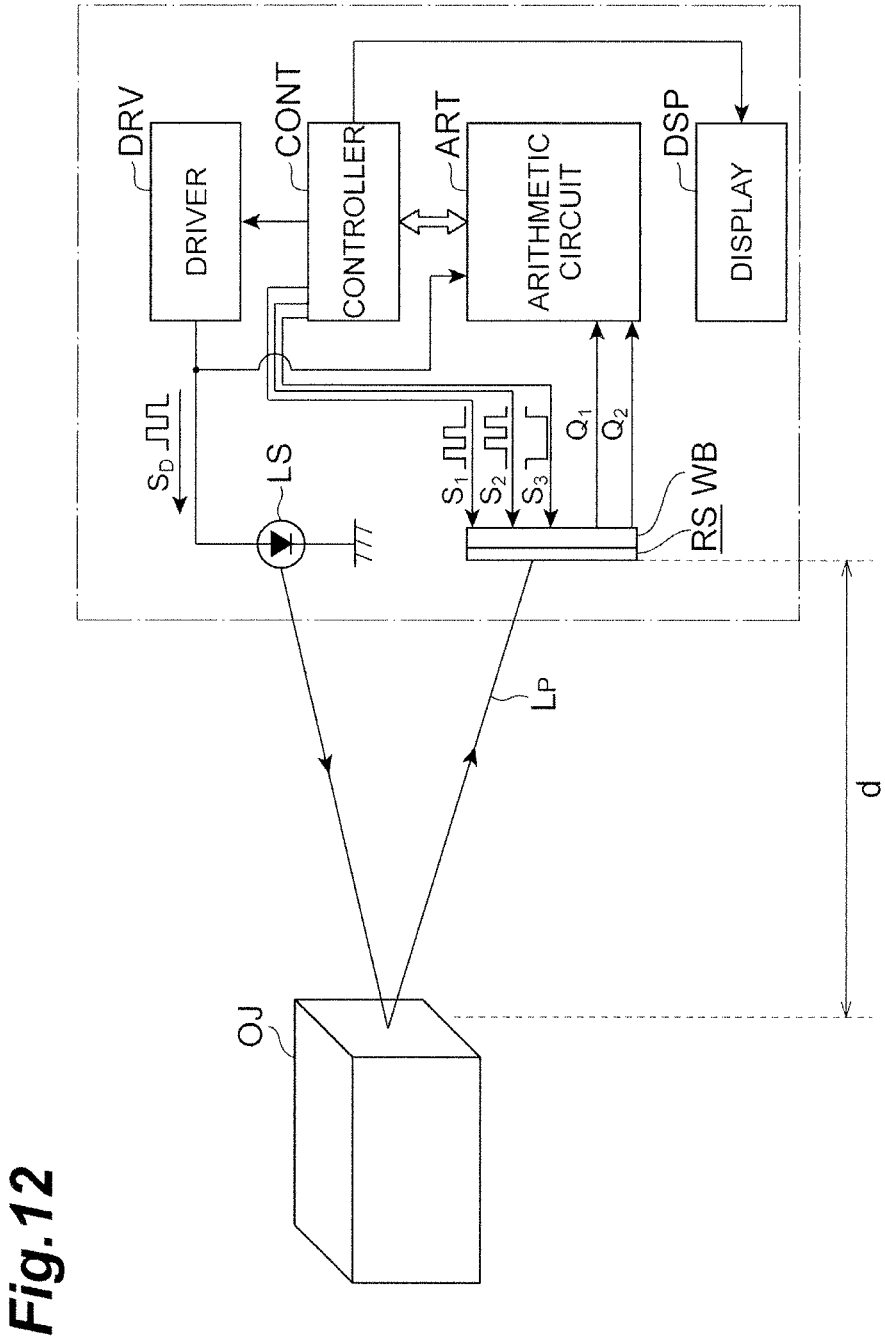
FIG. 12 is a drawing showing an overall configuration of a range image measuring device.

FIG. 12 is a drawing showing an overall configuration of a range image measuring device.

The range d to the object OJ is measured by the range image measuring device. As described above, the drive signal $S_D$ is applied to the light source LS such as a laser light irradiator and an LED and the intensity signal $L_p$ of a reflected light figure reflected by the object OJ is incident onto the charge generating regions of the range image sensor RS. The charge quantities $Q_1$, $Q_2$ collected in synchronism with the first and second transfer signals $S_1$, $S_2$ are output pixel by pixel from the range image sensor RS to be fed to an arithmetic circuit ART in synchronism with the drive signal $S_D$. The arithmetic circuit ART calculates the range d in each pixel as described above and transfers the calculation result to a controller CONT. The controller CONT controls a drive circuit DRV for driving the light source LS, outputs the first to third transfer signals $S_1$-$S_3$, and lets a display unit DSP display the calculation result fed from the arithmetic circuit ART.

The action and effect of the range image sensor RS configured as described above will be described. The action and effect of the range image sensor RS will be described below in comparison with a conventional range image sensor.

Figure 13:
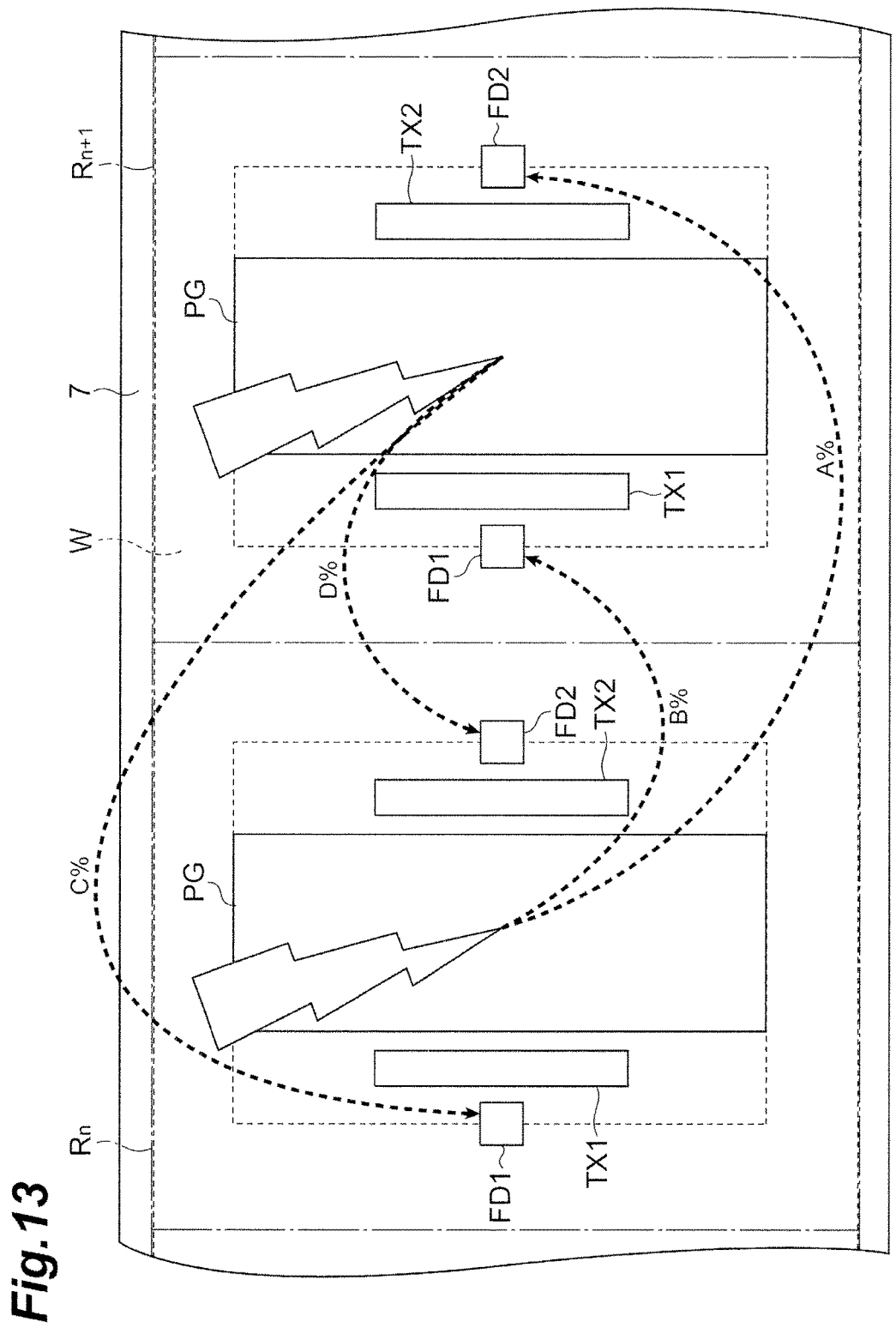
FIG. 13 is a drawing for explaining leakages of charges in a conventional range image sensor.

FIG. 13 is a drawing for explaining leakages of charges in the conventional range image sensor.

In the conventional range image sensor, each of a plurality of range sensors $R_1$ to $R_N$ disposed in a one-dimensional direction includes a first signal charge accumulating region FD1 and a first transfer electrode TX1 on one side in the one-dimensional direction of the photogate electrode PG and a second signal charge accumulating region FD2 and a second transfer electrode TX2 on the other side in the one-dimensional direction of the photogate electrode PG. Namely, the plurality of range sensors $R_1$-$R_N$ are disposed one-dimensionally in the charge distributing directions. In adjacent two range sensors $R_n$, $R_{n+1}$, the first signal charge accumulating region FD1 and the second signal charge accumulating region FD2 are adjacent in the one-dimensional direction. The conventional range image sensor further includes the p-type well regions W. The well region W, when viewed from the direction perpendicular to the second principal surface 1b, is formed in the second semiconductor region 5 to surround the photogate electrode PG, the first and second transfer electrodes TX1, TX2, and the first and second signal charge accumulating regions FD1, FD2. The well region W, when viewed from the direction perpendicular to the second principal surface 1b, overlaps a part of each of the first and second signal charge accumulating regions FD1, FD2. The outer edges of the well regions W are approximately coincident with the outer edges of the range sensors $R_1$-$R_N$.

In the range image sensor as described above, for example, when light is incident onto the range sensor $R_n$, charge according to the incident light is generated in the range sensor $R_n$. The generated charge is distributed into the first and second signal charge accumulating regions FD1, FD2 in response to the first and second transfer signals $S_1$, $S_2$. On this occasion, part of the charge leaks into the first and second signal charge accumulating regions FD1, FD2 of another range sensor R. Amounts of leakages are significantly different depending upon whether the dispositions of the first and second signal charge accumulating regions FD1, FD2 in the other range sensor R are on the range sensor $R_n$ side or not.

In the range sensor $R_{n+1}$, the first signal charge accumulating region FD1 is disposed on the range sensor $R_n$ side and the second signal charge accumulating region FD2 is disposed on the opposite side to the range sensor $R_n$. For this reason, when charge leaks from the range sensor $R_n$ to the range sensor $R_{n+1}$, a leakage amount B % into the first signal charge accumulating region FD1 becomes larger than a leakage amount A % into the second signal charge accumulating region FD2. Similarly, when light is incident onto the range sensor $R_{n+1}$ and when charge leaks from the range sensor $R_{1+1}$ to the range sensor $R_n$, since the second signal charge accumulating region FD2 is disposed on the range sensor $R_{n+1}$ side in the range sensor $R_n$, a leakage amount D % into the second signal charge accumulating region FD2 becomes larger than a leakage amount C % into the first signal charge accumulating region FD1.

If the ratio of the charge amount distributed into the first signal charge accumulating region FD1 by the first transfer electrode TX1 to the charge amount distributed into the second signal charge accumulating region FD2 by the second transfer electrode TX2 is the same in the range sensors $R_n$, $R_{n+1}$, the ranges measured by the range sensor $R_n$ and the range sensor $R_{n+1}$ should be the same. However, since charge leaks between the range sensors $R_n$, $R_{n+1}$, as described above, the charge amounts accumulated respectively in the first and second signal charge accumulating regions FD1, FD2 are different between the range sensor $R_n$ and the range sensor $R_{n+1}$. For this reason, the range measured by the range sensor $R_n$ can be different from that by the range sensor $R_{n+1}$.

In contrast to it, in the range image sensor RS according to the present embodiment the plurality of range sensors $P_1$ to $P_N$ are disposed in the one-dimensional direction A and each of the plurality of range sensors $P_1$ to $P_N$ includes the first and second signal charge accumulating regions FD1, FD2 on one side in the one-dimensional direction A of the photogate electrode PG and includes the third and fourth signal charge accumulating regions FD3, FD4 on the other side in the one-dimensional direction A of the photogate electrode PG. The first and fourth signal charge accumulating regions FD1, FD4 accumulate the signal charges made to flow in response to the first transfer signal $S_1$. The second and third signal charge accumulating regions FD2, FD3 accumulate the signal charges made to flow in response to the second transfer signal $S_2$. Namely, in each of the plurality of range sensors $P_1$ to $P_N$, the first and fourth signal charge accumulating regions FD1, FD4 to accumulate the signal charges made to flow in response to the first transfer signal $S_1$ are disposed respectively on both sides in the one-dimensional direction A of the charge generating region and, the second and third signal charge accumulating regions FD2, FD3 to accumulate the signal charges made to flow in response to the second transfer signal $S_2$ are disposed respectively on both sides in the one-dimensional direction A of the charge generating region. For this reason, in each of the plurality of range sensors $P_1$ to $P_N$, the charge leaking from the other range sensor is distributed with a good balance into the first and fourth signal charge accumulating regions FD1, FD4 to accumulate the signal charges made to flow in response to the first transfer signal $S_1$ and into the second and third signal charge accumulating regions FD2, FD3 to accumulate the signal charges made to flow in response to the second transfer signal $S_2$. Therefore, the effects of crosstalk of charges on the range measurement are the same between the range sensors adjacent in the one-dimensional direction A.

The range image sensor RS further includes the unnecessary charge collecting regions 11a-11d for collecting the charge generated in the charge generating region, as the unnecessary charges, and the third transfer electrodes TX3 for making the charge generated in the charge generating region, flow as unnecessary charges into the unnecessary charge collecting regions 11a-11d in response to the third transfer signal $S_3$ different in phase from the first and second transfer signals $S_1$, $S_2$. For this reason, the unnecessary charges can be discharged to the outside, which can improve the measurement accuracy of range.

In each of the plurality of range sensors $P_1$ to $P_N$, the first and second transfer electrodes TX1, TX2 are disposed opposite to each other with the photogate electrode PG in between in the one-dimensional direction A. Namely, in each of the plurality of range sensors $P_1$ to $P_N$, the first and second transfer electrodes TX1, TX2 are disposed without imbalance in the direction perpendicular to the one-dimensional direction A. For this reason, even in a case where light is incident onto only a portion of the photogate electrode PG in the direction perpendicular to the one-dimensional direction A and where there is imbalance of charge generated in the charge generating region, in the direction perpendicular to the one-dimensional direction A, less imbalance is produced between charge amounts distributed by the first and second transfer electrodes TX1, TX2. As a consequence, the accuracy of measured range is improved.

The present invention does not have to be limited to the above embodiment. For example, in the above embodiment the unnecessary charge collecting regions 11a-11d and the third transfer electrodes TX3 are disposed on the first long side L1 side or on the second long side L2 side of the photogate electrode PG, but the present invention does not have to be limited to this.

Figure 14:
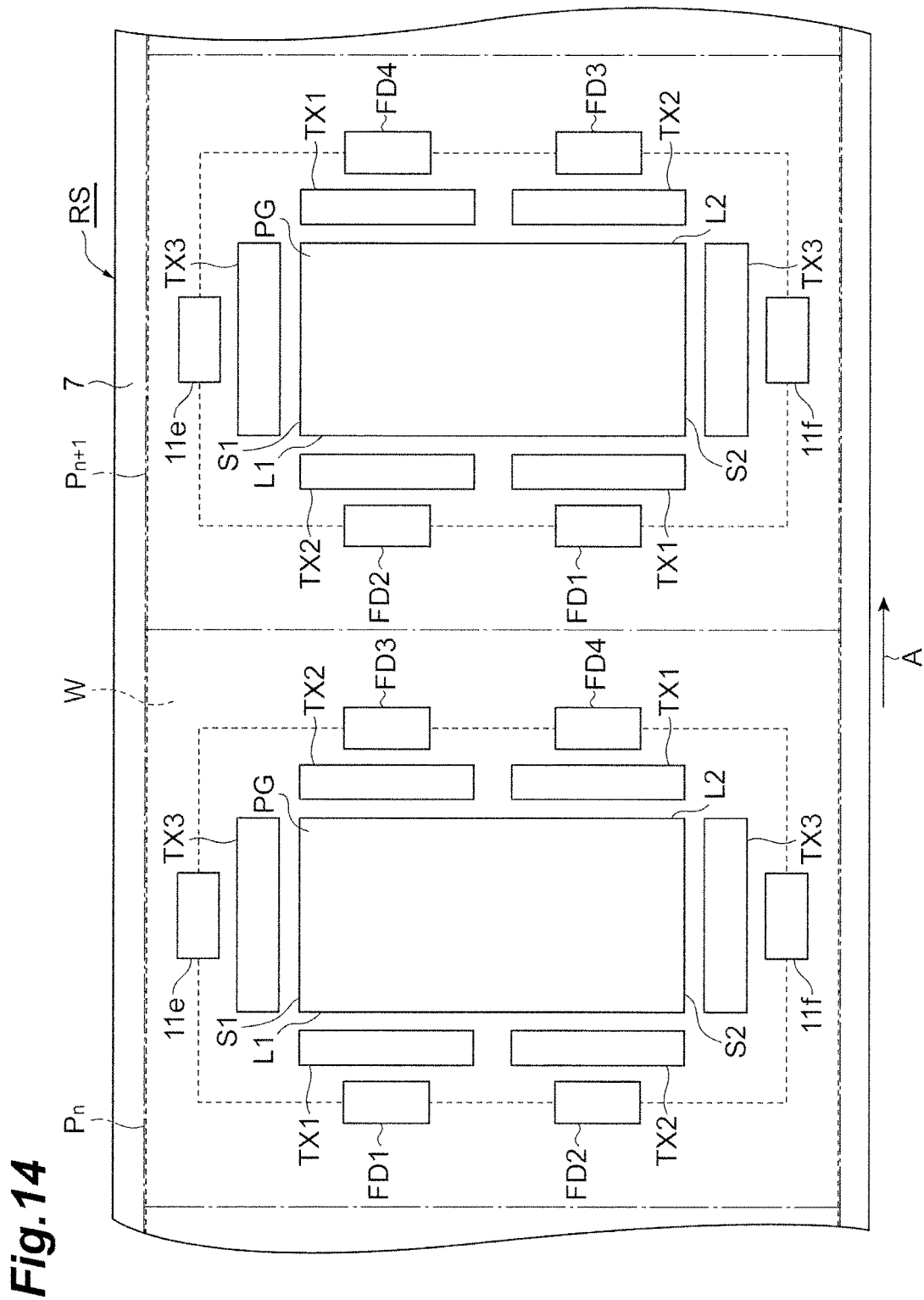
FIG. 14 is a schematic plan view showing pixels forming an imaging area of a range image sensor according to a modification example.

FIG. 14 is a schematic plan view showing pixels forming the imaging area of the range image sensor according to a modification example.

As shown in the same drawing, the range image sensor RS according to the modification example is different from the range image sensor RS according to the embodiment, mainly in that each of the plurality of range sensors $P_1$ to $P_N$ includes one unnecessary charge collecting region 11e and one unnecessary charge collecting region 11f disposed on the first short side S1 side and on the second short side S2 side, respectively, instead of the unnecessary charge collecting regions 11a-11d disposed on the first long side L1 side and on the second long side L2 side and includes two third transfer electrodes TX3 disposed on the first short side S1 side and on the second short side S2 side, instead of the four third transfer electrodes TX3 disposed on the first long side L1 side and on the second long side L2 side.

The unnecessary charge collecting region 11e is disposed away from the photogate electrode PG, on the first short side S1 side of the photogate electrode PG. The unnecessary charge collecting region 11f is disposed away from the photogate electrode PG, on the second short side S2 side of the photogate electrode PG. Namely, the unnecessary charge collecting regions 11e, 11f are disposed with the photogate electrode PG in between in the direction perpendicular to the one-dimensional direction A and away from the photogate electrode PG. The unnecessary charge collecting regions 11e, 11f are of a rectangular shape on the plan view. In this example, they are shaped in a rectangle, are identical in shape with each other, and have the long sides parallel to the one-dimensional direction A. The first to fourth signal charge accumulating regions FD1-FD4 are shaped in a rectangle on the plan view, are identical in shape with each other, and have the long sides parallel to the direction perpendicular to the one-dimensional direction A.

The third transfer electrodes TX3 are disposed respectively between the unnecessary charge collecting regions 11e, 11f and the photogate electrode PG. The third transfer electrodes TX3 are disposed respectively away from the unnecessary charge collecting regions 11e, 11f and the photogate electrode PG. In this example, the third transfer electrodes TX3 are shaped in a rectangle on the plan view, are identical in shape with each other, and have the long sides parallel to the one-dimensional direction A. The length of each of the long sides is equal to the length of the first and second short sides S1, S2 of the photogate electrode PG, for example. The length of each long side of the first and second transfer electrodes TX1, TX2 is approximately equal to half the length of each of the first and second long sides L1, L2 of the photogate electrode PG, for example.

The range image sensor RS of this configuration can also achieve the same action and effect as the range image sensor RS shown in FIG. 2. The sensor may further include the necessary charge collecting regions 11e, 11f and third transfer electrodes TX3 disposed on the first short side S1 side or on the second short side S2 side of the photogate electrode PG, in addition to the unnecessary charge collecting regions 11a-11d and the third transfer electrodes TX3 disposed on the first long side L1 side and on the second long side L2 side of the photogate electrode PG.

The number of unnecessary charge collecting regions does not have to be limited to four or two but can be set as occasion may demand, or can be null. The disposition of the unnecessary charge collecting regions may be, for example, between the first and second transfer electrodes TX1, TX2 and they can be disposed as occasion may demand.

The range image sensor RS is the line sensor in which the plurality of range sensors $P_1$ to $P_N$ each are one-dimensionally disposed, but they may be two-dimensionally disposed. In this case, the sensor can readily obtain a two-dimensional image. The two-dimensional image can also be obtained by rotating the line sensor or by using two lines sensors to scan.

The range image sensor RS is not limited to the front-illuminated range image sensor. The range image sensor RS may be a back-illuminated range image sensor.

The charge generating region where charge is generated according to incident light may be composed of a photodiode (e.g., an embedded photodiode or the like).

The conductivity types of p-type and n-type in the range image sensor RS according to the present embodiment may be replaced to be opposite to those described above.

INDUSTRIAL APPLICABILITY

The present invention is applicable to the charge distribution type range image sensors.

REFERENCE SIGNS LIST 11a to 11f unnecessary charge collecting regions; A one-dimensional direction; FD1 first signal charge accumulating region; FD2 second signal charge accumulating region; FD3 third signal charge accumulating region; FD4 fourth signal charge accumulating region; $P_1$ to $P_N$ range sensors; PG photogate electrode; RS range image sensor; $S_1$ first transfer signal; $S_2$ second transfer signal; $S_3$ third transfer signal; TX1 first transfer electrode; TX2 second transfer electrode; TX3 third transfer electrode.

The invention claimed is:

1. A range image sensor in which a plurality of range sensors are disposed in a one-dimensional direction,
wherein each of the plurality of range sensors comprises:
a charge generating region where charge is generated according to incident light;
a first and second signal charge accumulating regions disposed away from the charge generating region on one side in the one-dimensional direction of the charge generating region and away from each other along a direction perpendicular to the one-dimensional direction, and configured to accumulate the charge generated in the charge generating region, as signal charges;
a third signal charge accumulating region disposed away from the charge generating region on the other side in the one-dimensional direction of the charge generating region and opposite to the first signal charge accumulating region with the charge generating region in between in the one-dimensional direction, and configured to accumulate the charge generated in the charge generating region, as a signal charge;
a fourth signal charge accumulating region disposed away from the charge generating region on the other side in the one-dimensional direction of the charge generating region and opposite to the second signal charge accumulating region with the charge generating region in between in the one-dimensional direction, and configured to accumulate the charge generated in the charge generating region, as a signal charge;
two first transfer electrodes disposed respectively between the first and fourth signal charge accumulating regions and the charge generating region and configured to make the charge generated in the charge generating region, flow as the signal charges into the first and fourth signal charge accumulating regions in response to a first transfer signal; and
two second transfer electrodes disposed respectively between the second and third signal charge accumulating regions and the charge generating region and configured to make the charge generated in the charge generating region, flow as the signal charges into the second and third signal charge accumulating regions in response to a second transfer signal different in phase from the first transfer signal, and
wherein in any two mentioned range sensors adjacent in the one-dimensional direction, the first signal charge accumulating region and the fourth signal charge accumulating region are adjacent in the one-dimensional direction and substantially aligned in the one-dimensional direction, and the second signal charge accumulating region and the third signal charge accumulating region are adjacent in the one-dimensional direction and substantially aligned in the one-dimensional direction.

2. The range image sensor according to claim 1, further comprising:
a plurality of unnecessary charge collecting regions disposed away from the charge generating region on the one side and on the other side in the one-dimensional direction of the charge generating region and configured to collect the charge generated in the charge generating region, as unnecessary charges; and
a plurality of third transfer electrodes disposed respectively between the plurality of unnecessary charge collecting regions and the charge generating region and configured to make the charge generated in the charge generating region, flow as the unnecessary charges into the plurality of unnecessary charge collecting regions in response to a third transfer signal different in phase from the first and second transfer signals.

3. The range image sensor according to claim 1, further comprising:
a plurality of unnecessary charge collecting regions disposed with the charge generating region in between in the direction perpendicular to the one-dimensional direction and away from the charge generating region and configured to collect the charge generated in the charge generating region, as unnecessary charges; and
a plurality of third transfer electrodes disposed respectively between the plurality of unnecessary charge collecting regions and the charge generating region and configured to make the charge generated in the charge generating region, flow as the unnecessary charges into the plurality of unnecessary charge collecting regions in response to a third transfer signal different in phase from the first and second transfer signals.

* * * * *